United States Patent [19]

Grenon

[11] 3,940,846
[45] Mar. 2, 1976

[54] SCANNABLE LIGHT EMITTING DIODE ARRAY AND METHOD

[75] Inventor: Lawrence A. Grenon, Phoenix, Ariz.

[73] Assignee: Motorola, Inc., Chicago, Ill.

[22] Filed: Dec. 14, 1973

[21] Appl. No.: 424,998

Related U.S. Application Data

[62] Division of Ser. No. 188,274, Oct. 12, 1971, abandoned.

[52] U.S. Cl. .................... 29/577; 29/578; 29/580; 357/45
[51] Int. Cl.² ........................................ B01J 17/00
[58] Field of Search ............ 29/569 L, 576 IW, 580, 29/577, 577 IC, 578; 357/45

[56] References Cited
UNITED STATES PATENTS

| | | | |
|---|---|---|---|
| 3,377,513 | 4/1968 | Ashby | 29/577 IC |
| 3,381,182 | 4/1968 | Thornton | 29/576 IW |
| 3,509,433 | 4/1970 | Schroeder | 29/576 IW |
| 3,667,004 | 5/1972 | Kuhn | 29/569 L |

OTHER PUBLICATIONS

Solid State Science, Dec. 1969, pp. 1725–1732, Manasevit et al., "The Use of Metal-Organics in . . . Semiconductor Materials."

*Primary Examiner*—W. Tupman
*Attorney, Agent, or Firm*—Harry M. Weiss; Henry T. Olsen

[57] ABSTRACT

There is disclosed a monolithic light display comprising a matrix of light emitting diodes in an integral structure which is scannable to produce an alpha numeric character display. Each of the light emitting diodes is electrically isolated from each other diode in a supporting carrier, with the cathodes of the diodes connected in a series of groups by address lines and anodes connected in an orthagonal plurality of groups by bit lines or column lines. A strobing format logic address system is provided for lighting the individual diodes to emission for producing an alpha numeric character.

There is also disclosed a method of making the foregoing which comprises moat etching a semiconductor substrate of a first conductivity to form a plurality of mesas in an orthagonal pattern desired for the ultimate alpha numeric display. A region of the opposite conductivity is then produced on the moat etched surface of the substrate by diffusing a suitable dopant therein. The PN junction is thereby formed following the contour of the moat etched surface. A layer of material is then deposted upon the diffused surface and a supporting carrier deposited over the first layer. If the first layer is of conductive material, the supporting carrier is required to be of dielectric material. If the first layer is of a dielectric material, the carrier may be either dielectric, heat conductive, or electrically conductive material. The original substrate is then removed by lapping, etching or polishing to leave only the mesas in a dielectrically isolated array. Suitable electrical connections are made to the individual diodes to complete the display.

7 Claims, 12 Drawing Figures

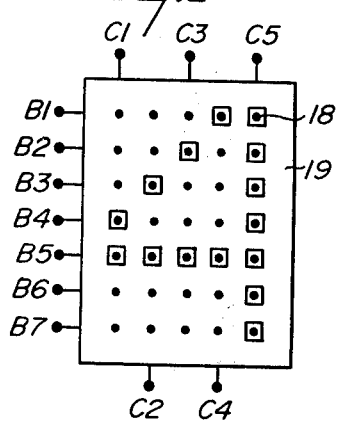
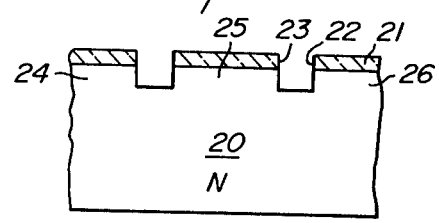
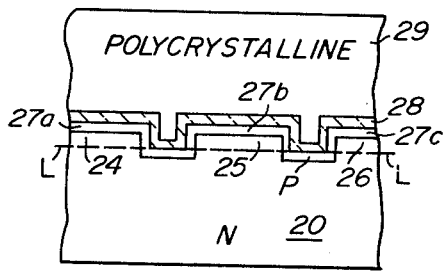
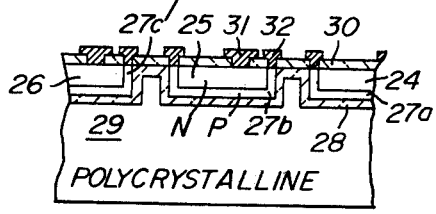
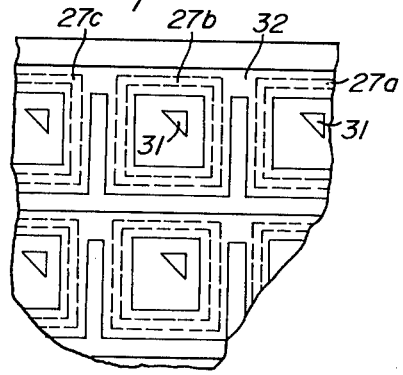

SCANNABLE LIGHT EMITTING DIODE ARRAY AND METHOD

This is a division of application Ser. No. 188,274, filed Oct. 12, 1971, now abandoned.

BACKGROUND OF THE INVENTION

This invention relates to alpha numeric displays and more particularly to a monolithic light emitting diode display. More particularly, the invention is related to a light emitting diode display which is scannably addressable.

Visual readout devices such as alpha numeric displays are available in several formats utilizing various light emitting devices such as incandescent lamps, gaseous discharge lamps, electroluminescent arrays and more recently, light emitting diode arrays. Such devices are utilized for many purposes such as computer readouts, process control instrumentation, aircraft and automotive instrument panels, and various other indicators such as clocks and gauges. Since most, if not all of the aforementioned uses, rely on semiconductor electronics, it is highly desirable that the alpha numeric display be compatible with the voltages and currents normally utilized in such semiconductor circuits and be compatible with its speed of operation. The major objection to the presently most widely used visual readout, the gas discharge lamp of the cathode glow variety, is the high voltage required for initiating the glow discharge. Such readouts require the use of interface semiconductors having high reverse voltage breakdown characteristics. Obviously, the light emitting diode array format, being itself a semiconductor device, is highly desirable for a visual readout since it is inherently compatible with the electronics of the semiconductor circuits.

Some attempts have been made to provide alpha numeric displays utilizing light emitting diodes in either discrete, hybrid or individually addressable diode bit arrays. In these formats, light emitting diode arrays have not been widely acceptable, as they are costly, unreliable and relatively inconvenient to adapt to standard systems.

SUMMARY OF THE INVENTION

It is a primary object of this invention to provide a monolithic light emitting diode alpha numeric display device and method.

A further object of the invention is to provide a monolithic light emitting diode alpha numeric display which is relatively economic and compatible with standard systems.

In accordance with the aforementioned objects, there is provided a monolithic light display comprising a matrix of light emitting diodes in an integral structure, said light emitting diodes being arranged in columns and rows, a first level of metallization contacting the anodes of all of said light emitting diodes in each of the plurality of rows and a second level of metallization contacting the cathodes of said diodes in each of the plurality of columns.

THE DRAWINGS

Further objects and advantages of the invention will be obvious to one skilled in the art from the following complete description thereof and from the drawings wherein:

FIG. 1 is a plan view of a monolithic light emitting diode array in accordance with the preferred embodiment of the invention depicted somewhat schematically;

FIGS. 2-5 are cross sectional views depicting schematically successive stages in the manufacture of the light emitting diode array;

FIGS. 6 and 7 are top plan views of portions of the array depicting the two levels of metallization therefor;

DETAILED DESCRIPTION

Figure 7:
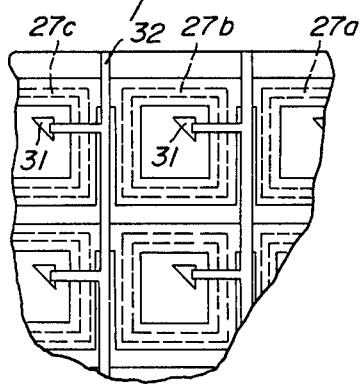

While the following preferred embodiment of the invention is disclosed with particular reference to a monolithic array of gallium arsenide phosphide light emitting diodes, it will be appreciated that any optimum light emitting diode material such as gallium arsenide or gallium phosphide may be used. The carrier substrate for the array may be of any suitable material such as a semiconductor, a metal conductor or an insulating material, the particular selection of material being based on several criteria. For example, one of the current limiting values for a light emitting diode and hence, light output, will be based upon the heat or power dissipation characteristic of the substrate. Thus, for maximum dissipation of heat from the light emitting diode, a good power dissipating metal conductor backing carrier would be desirable so that the light emitting diodes could be operated up to a maximum intensity. However, the connection of the array into rows and columns may be conveniently arranged by use of the second embodiment of the manufacture wherein the layer immediately beneath the photo diodes is a conductor which eliminates a later step of metallization, and it may be desirable to have the carrier of insulating material similarly. A carrier layer composed entirely of insulating material may be satisfactory and eliminate a processing step encountered when using a conductive layer beneath the diode. Grounding of any capacitive charging of the substrate may be required to prevent slower speed of operation such that a semiconductor carrier would be the most desirable material.

In accordance with the preferred embodiment of the invention as shown in FIG. 1, the light emitting diode array comprises a plurality of light emitting diodes 18 arranged in a monolithic support structure 19 in an orthagonal matrix of rows and columns. As shown, the matrix comprises five light emitting diodes in each row and seven light emitting diodes in each column for a total of thirty-five light emitting diodes 21 comprising the array. Contacts B1-B7 are provided making contact with the anodes of each of the rows of light emitting diodes and contacts C1-C5 are provided for contacting the cathodes of the light emitting diodes in each column. Thus, a suitable strobing or scanning type logic matrix can individually address the light emitting diodes to cause each to emit light in a suitable alpha numeric pattern. The pattern indicated by the aura around various of the light emitting diodes being depicted as indicated the numeral "4." Each column is addressed during a particular clock pulse of the logic matrix and suitable of the light emitting diodes will be switched to emit light by addressing the desired anode through the row contacts. The crossing conductive paths comprising the column contacts C1–C5 and row contacts B1–B7 will be explained hereinafter in greater detail.

The successive steps in the manufacture of the light emitting diode array is depicted in FIGS. 2–7 which method has as its purpose obtaining the anodes of the light emitting diodes beneath the cathodes since the N-conductivity material of which the light emitting diode has been found to absorb less light than the P-conductivity material. As shown in FIG. 2, a substrate 20 of monocrystalline semiconductor material, preferably gallium arsenide phosphide, is coated with a suitable masking layer 21 in which suitable windows 22 are formed by a standard photolithographic technique. The substrate 20 is then etched to form the moats 23 of about 2 mils surrounding a plurality of mesas 24 to 26. After removal of the masking layer 21, a dopant is diffused into the entire surface of the substrate 20 to form the P-type region 27. The diffusion is sufficiently deep, i.e., greater than 1 mil, to permit the later contacting thereof. The P-conductivity region 27 as shown in FIG. 3 thus conforms to the mesa and moat configuration of the prepared substrate. A first layer 28 of dielectric material is then deposited upon the substrate and entirely covers the same. A supporting carrier 29 preferably of polycrystalline silicon, is then deposited on the first layer 28 and most of the original substrate is removed to the lapline L—L by suitable lapping and polishing steps to form the mesa regions into isolated islands 24, 25 and 26 forming the light emitting diodes 21. The N-regions are thus made relatively thin to minimize light absorption.

Following removal of the bulk of the substrate 20, the new surface along the lapline L—L becomes the surface on which further operations are to take place, hence FIG. 5 rotated 180° relative to FIG. 4 so that the lapline L—L now appears as the upper surface. The P-conductivity diffusion regions are segregated into separate regions 27a, 27b and 27c and together with regions 24, 25, and 26, now define separate light emitting diodes. Following the lapping, a dielectric layer 30 is placed over the new surface of the device, and windows are opened therein for the first conductive or metallization layer which may be placed either entirely over the dielectric layer 30 and through the windows or in a particular pattern. Following an entire layering of metallization, by suitable photomask techniques, the metallization is etched to form contacts 31 to the N-conductivity regions, and contacts 32 to the P-conductivity regions. The contacts 31 and 32 are shown in plan view in FIG. 6, and as shown there, the contacts 31 are generally triangular or other suitable shapes contacting the portion each of the N-conductivity regions while the contacts 32 contact those portions of the P-conductivity regions which extend to the planar surface formed by the lapline L—L and hence, encircle the diode. Metallization is left interconnecting the contacts 32 to define the row lines by which the anodes of light emitting diodes are to be electrically contacted. Following a further layer of dielectric material over the first metallization, windows are opened to the contacts 31 and a second level of metallization 32 (FIG. 7) defines the column lines C1–C5 for contacting of the cathodes of the photo diodes. It will thus be seen that with a particular column line C1–C5 energized, and a particular row line B1–B7 energized, one and only one photo diode will be energized to emit light. By scanning down the column and rows, individual photo diodes will be energized to define an alpha numeric character for display.

Figure 8:
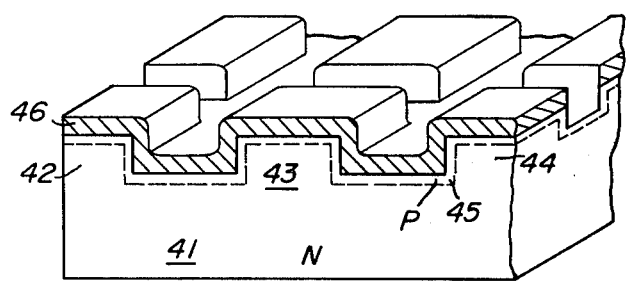
FIGS. 8-11 are views indicating successive stages in the manufacture of the array in accordance with another embodiment.
Figure 9:
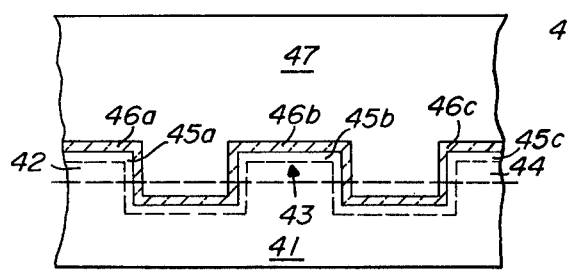
Figure 10:
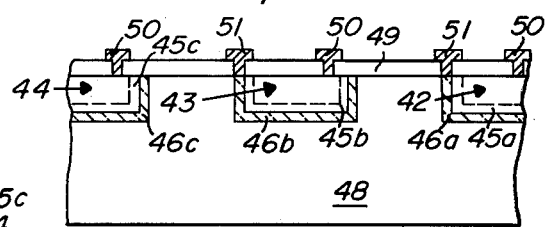
Figure 11:
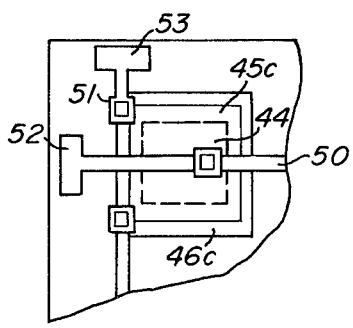

The P-conductivity region may be contacted in another manner if it is desirable to use a dielectric layer for the supporting carrier. This method of manufacture is depicted in FIGS. 8–11. As depicted in FIG. 8, following the moat etching of an N-conductivity substrate 41, and the forming of mesas 42, 43 and 44, a P-diffusion 45 is placed in the surface of the substrate 41. Instead of a first layer of dielectric material, a first layer 46 of conductive material, which might be polycrystalline silicon doped to give it substantial conductivity. A supporting carrier 47 of dielectric material is placed thereover (FIG. 9). Then, the original N-conductivity substrate 41 is removed by a lapping technique to the lapline L—L to expose the P-conductivity regions 45 at the surface as well as the conductive layer 46 surrounding the P-conductivity regions. A dielectric layer 49 is then deposited on the surface defined by the lapline L—L (FIG. 10). Windows therein are opened to the P-conductivity regions and to the conductive layers 46a–46c and a metallization layer placed over the device by masking and etching techniques. Certain of the metallization is etched into the pattern depicted in FIG. 11 to define the contacts 50 and 51 and bonding pads 52 and 53.

Since the conductive region 46 will define a tunnel conductor, the contacts 51 may terminate to define column lines from the bonding pad 53 down through the conductive layer 46 and be continued with a new contact 51 to the next photo diode in the particular column. The bonding pad 52 for the row column is connected to a continuous surface metallization line 50. It is thus seen that the first layer of conductor 46, being placed prior to the deposition of the supporting substrate, reduces a later metallization step as contrasted with the first embodiment.

Figure 12:
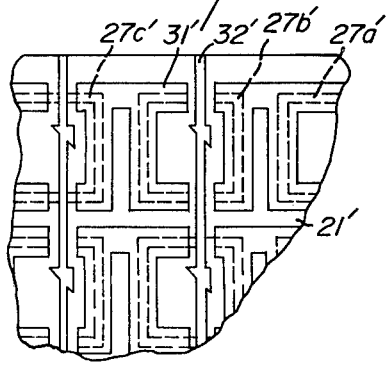
FIG. 12 is a plan view depicting still another embodiment.

As shown in FIG. 12, the row and column metallization can be accomplished in a single level metallization if the conductivity of the P-regions 27c', 27b' and 27a' is sufficiently high. The contacts 31' are generally C-shaped with space left for column contacts 32'. Thus, the P-regions are utilized as tunnel conductors.

While certain preferred embodiments of the invention have been given by way of a specific disclosure thereof, it is obvious that suitable changes and modifications can be made without departing from the spirit and scope of the invention.

I claim:
1. A process for the manufacture of a matrix of light emitting diodes, comprising the steps of:
   a. forming a plurality of mesas in an orthagonal pattern on a monocrystalline semiconductor substrate of a first conductivity;
   b. diffusing an opposite conductivity effecting material into the surface of said substrate to form a light emitting PN junction adjacent the surfaces of said mesas;
   c. forming a supporting carrier over the entire surface of said substrate;
   d. removing said monocrystalline substrate to separate said mesas into an orthagonal matrix of light emitting diodes electrically isolated in said supporting carrier and with the PN junction extending to the surface;
   e. depositing a dielectric layer over the surface of the ioslated photo diodes;

f. placing a conductive layer thereon contacting said light emitting diodes in a plurality of rows;

g. placing a second dielectric layer thereon; and h. placing a conductive layer thereon contacting said light emitting diodes in a plurality of columns.

2. A process as recited in claim 1 wherein said monocrystalline substrate is selected from the group consisting of gallium arsenide, gallium phosphide and gallium arsenide phosphide.

3. A process as recited in claim 2 wherein said monocrystalline substrate is gallium arsenide phosphide.

4. A process as recited in claim 1 wherein said carrier substrate is selected from the group consisting of polycrystalline silicon and germanium.

5. A process as recited in claim 1 wherein said monocrystalline substrate is removed by lapping.

6. A process as recited in claim 1 and further including the step of depositing a dielectric layer upon said mesas prior to deposition of the supporting carrier.

7. A process as recited in claim 6 wherein said dielectric material is of a material selected from the group consisting of silicon dioxide, silicon nitride and aluminum oxide.

* * * * *